United States Patent
Lee

(10) Patent No.: US 7,473,984 B2
(45) Date of Patent: Jan. 6, 2009

(54) METHOD FOR FABRICATING A METAL-INSULATOR-METAL CAPACITOR

(75) Inventor: June Woo Lee, Osan-si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/710,917

(22) Filed: Feb. 27, 2007

(65) Prior Publication Data

US 2007/0190774 A1    Aug. 16, 2007

Related U.S. Application Data

(62) Division of application No. 11/320,590, filed on Dec. 30, 2005, now Pat. No. 7,202,158.

(30) Foreign Application Priority Data

Jun. 27, 2005 (KR) .................... 10-2005-0055563

(51) Int. Cl.
*H01L 29/40* (2006.01)

(52) U.S. Cl. ............... 257/621; 257/774; 257/E23.145; 257/E23.627

(58) Field of Classification Search .............. 257/621, 257/774, E23.145, E23.627; 438/622, 637
See application file for complete search history.

(56) References Cited

U.S. PATENT DOCUMENTS 6,898,851 B2    5/2005    Nishioka et al.

*Primary Examiner*—Quoc D Hoang
(74) *Attorney, Agent, or Firm*—Lowe Hauptman Ham & Berner, LLP

(57) ABSTRACT

A method fabricating multiple wiring metals in a semiconductor device. The method includes forming a lower wiring metal on a semiconductor substrate, forming an interlayer dielectric on the lower wiring metal, and selectively removing the interlayer dielectric to form a contact dielectric film, a body dielectric film and an opening between the contact and body dielectric films. The method also includes filling the opening with low-k material, forming a capping dielectric on the contact and body dielectric films and the low-k material, forming a contact hole passing through the capping dielectric and the contact dielectric film to be connected to the lower wiring metal, and forming an upper wiring metal electrically interconnected to the lower wiring metal through the contact hole.

12 Claims, 5 Drawing Sheets

METHOD FOR FABRICATING A METAL-INSULATOR-METAL CAPACITOR

CROSS REFERENCE TO RELATED APPLICATION

This application is a divisional of U.S. Ser. No. 11/320,590, filed on Dec. 30, 2005 now U.S. Pat. No. 7,202,158. This application, in its entirety, is incorporated herein by reference.

CROSS-REFERENCE TO RELATED APPLICATION

This application claims priority to and the benefit of Korean Patent Application No. 10-2005-0055563 filed in the Korean Intellectual Property Office on Jun. 27, 2005, the entire contents of which are incorporated herein by reference.

BACKGROUND OF THE INVENTION

1. Field of the Invention

The present invention relates to multiple wiring technologies, and more specifically, to a multiple wiring metal structure employing low-k dielectric material and a method for fabricating such a structure in a semiconductor device.

2. Discussion of the Related Art

Logic IC devices are progressing to achieve higher operational speed and higher integration with a miniaturization of components such as transistors. Such highly integrated transistors require smaller wiring for interconnecting circuit elements and for paths for power supply and signal transmission. Among other limitations, signal delay in the fine metal wires becomes significant in decreasing the operational speed.

Copper having low electric resistance (e.g., 62% than aluminum metal) is used as a material for wiring metal, and material having lower dielectric constant (low-k) is used for insulating or dielectric material between multiple copper metal layers. With these materials, parasitic capacitance between the upper and lower wiring metals is decreased to enable a higher operational speed and to reduce crosstalk between circuit elements. For minimizing the signal delay, it is not sufficient to employ only conductive material having lower resistance, and thus it has to be combined with the interlayer dielectric material of low-k.

Very low-k (VLK) dielectric material having less than "3.0" of dielectric constant may be a candidate for the next generation interlayer dielectric material. This is because the conventional low-k material such as undoped silicate glass (USG) and fluoro-silicate glass (FSG) reveals limits in applying to existing fabrication capability due to signal cross talk as the width and thickness of the interlayer dielectric decreases.

For overcoming the limits, various low-k dielectrics such as carbonate silicate glass (CSG), alpha-fluorinated amorphous carbon (α-FC), and hydrogen silsesquioxane (HSQ) have been developed. However, they reveal problems of, e.g., inferior stability and outgassing in subsequent thermal processes.

SUMMARY OF THE INVENTION

It is an object of the present invention to overcome the limits of conventional low-k materials.

In a first aspect, embodiments of the present invention are directed to a method fabricating multiple wiring metals in a semiconductor device, comprising the steps of: forming a lower wiring metal on a semiconductor substrate; forming an interlayer dielectric on the lower wiring metal; selectively removing the interlayer dielectric to form a contact dielectric film, a body dielectric film and an opening between the contact and body dielectric films; filling the opening with low-k material; forming a capping dielectric on the contact and body dielectric films and the low-k material; forming a contact hole passing through the capping dielectric and the contact dielectric film to be connected to the lower wiring metal; and forming an upper wiring metal electrically interconnected to the lower wiring metal through the contact hole.

In a second aspect, embodiments of the present invention are directed to a multiple wiring metal structure comprising: a lower wiring metal formed on a semiconductor substrate; a contact dielectric film and a body dielectric film formed on the lower wiring metal; a low-k dielectric filling opening between the contact and body dielectric films; a capping dielectric formed on the contact and body dielectric films and the capping dielectric; and an upper wiring metal electrically interconnected to the lower wiring metal through a contact hole formed by passing through the capping dielectric and the contact dielectric film.

The low-k dielectric includes carbonate silicate glass (CSG), alpha-fluorinated amorphous carbon (α-FC), and hydrogen silsesquioxane (HSQ).

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

FIGS. 1 to 8 are cross-sectional views for illustrating the processing steps for fabricating multiple wiring metals in a semiconductor device according to the present invention.

Figure 1:
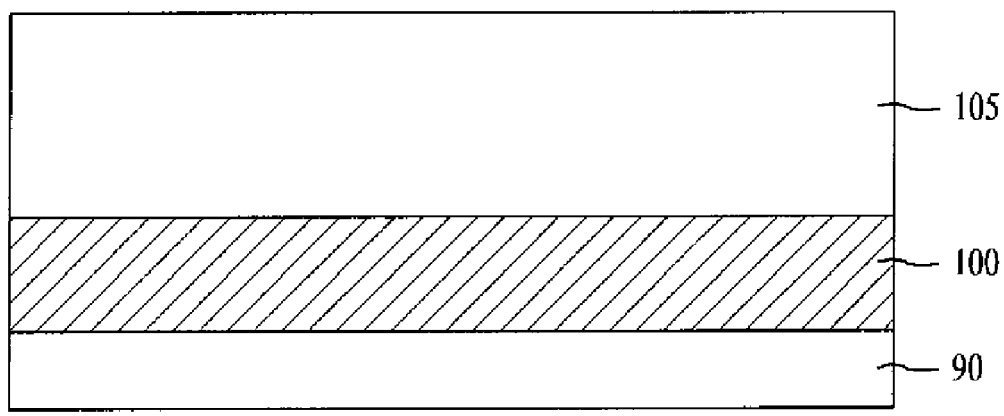
FIGS. 1 to 8 are cross-sectional views illustrating a method for manufacturing multiple wiring metals in semiconductor IC devices according to the present invention.

Referring to FIG. 1, an interlayer dielectric 105 is deposited on a lower wiring metal 100 that can be formed on a semiconductor substrate 90.

Figure 2:
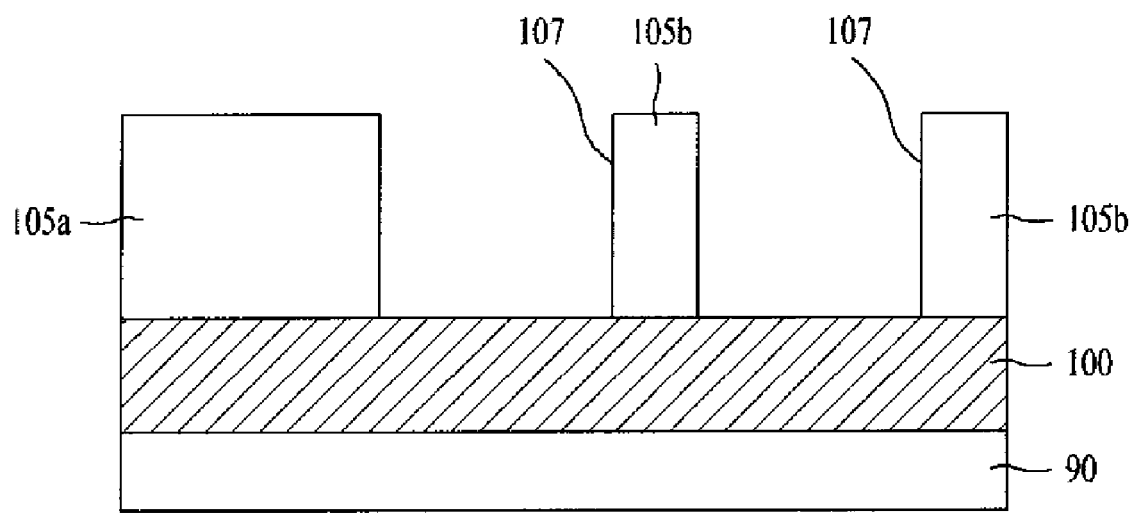

Referring FIG. 2, the interlayer dielectric 105 is selectively etched by a conventional photolithographic process until the lower wiring metal 100 is exposed. The selective etching of the interlayer dielectric 105 forms contact dielectric films 105a and body dielectric films 105b. Thus, openings 107 are formed between neighboring contact dielectric films 105a and body dielectric films 105b. The openings 107 are filled with low-k dielectric material as explained below. Though not shown in FIG. 2, a part of the interlayer dielectric material can remain on the surface of lower wiring metal 100 at the openings 107.

Figure 3:
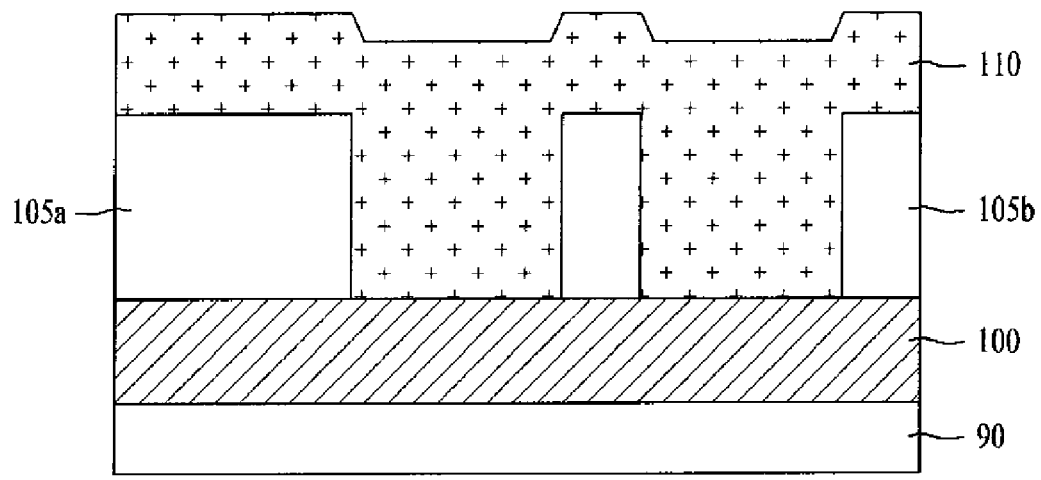

Referring to FIG. 3, low-k material 110 is deposited to fill the openings 107 between the contact dielectric films 105a and body dielectric films 105b. The low-k material 110 includes carbonate silicate glass (CSG), alpha-fluorinated amorphous carbon (α-FC), and hydrogen silsesquioxane (HSQ), and can be deposited by a silicon on glass (SOG) or a chemical vapor deposition (CVD) technique.

Figure 4:
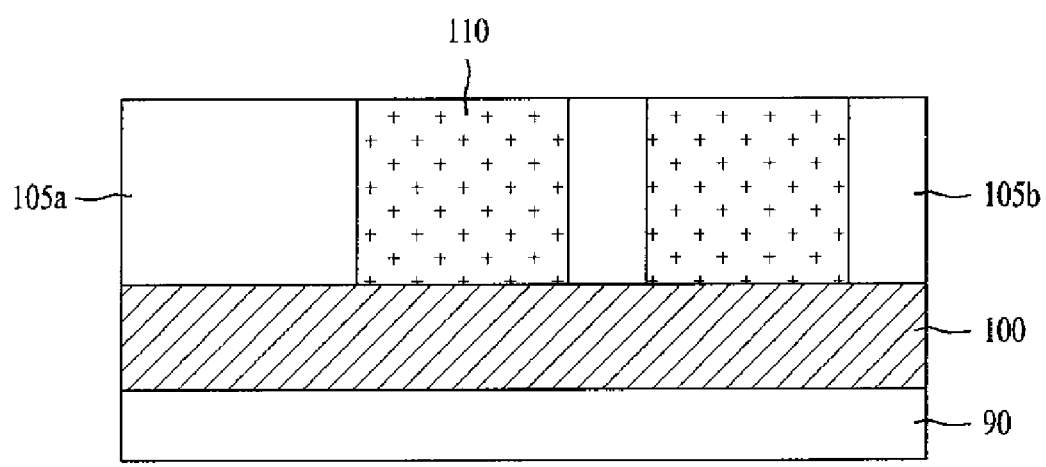

Referring to FIG. 4, the surface of the deposited low-k material 110 is polished or planarized until the contact dielectric film 105a and body dielectric film 105b are exposed. The planarization can be performed by a chemical mechanical polishing (CMP) or an etch-back technique. With this processing step, the low-k material 110 fills the opening 107.

Figure 5:
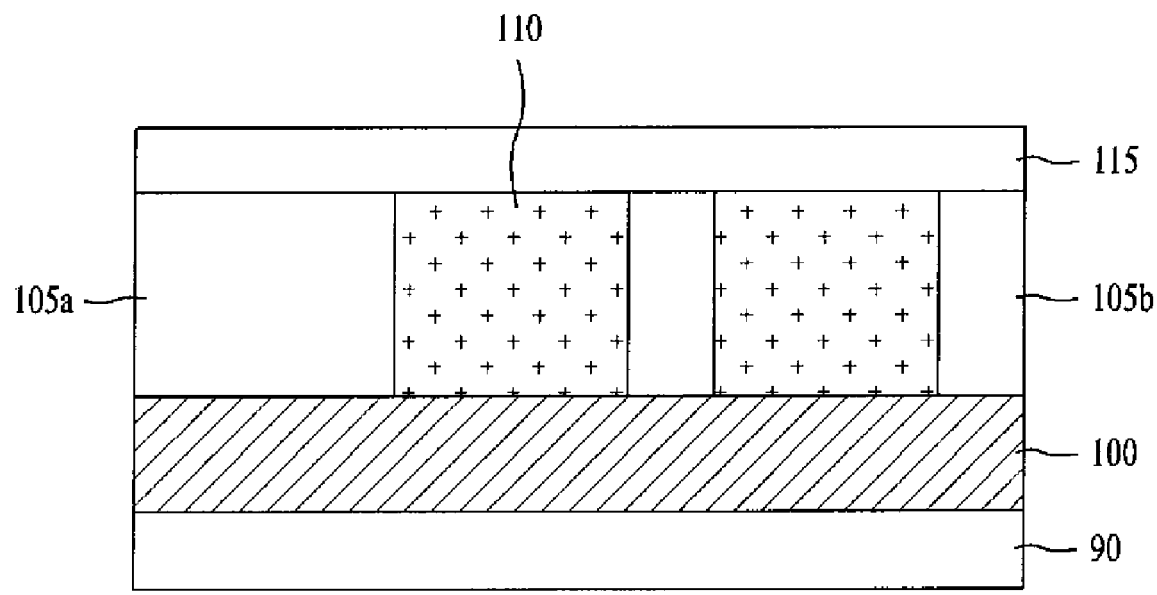

Referring to FIG. 5, capping dielectric 115 is formed on the entire surface of the planarized substrate. The capping dielectric 115, formed by, e.g., silicon-rich oxide, prevents pattern peeling of the underlying low-k dielectric 110 due to outgas in subsequent processing steps.

Figure 6:
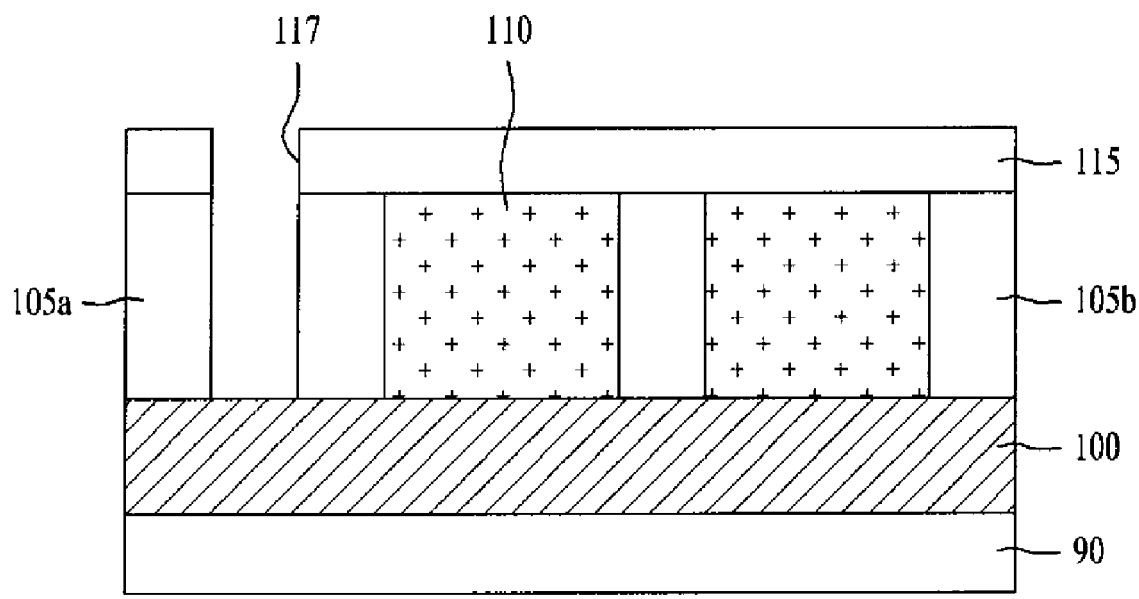

Referring to FIG. 6, the capping dielectric 115 and contact dielectric film 105a are selectively removed, until the lower wiring metal 100 exposes, by photolithographic technique to form a contact hole 117 which passes through the contact dielectric film 105a and capping dielectric 115.

Figure 7:
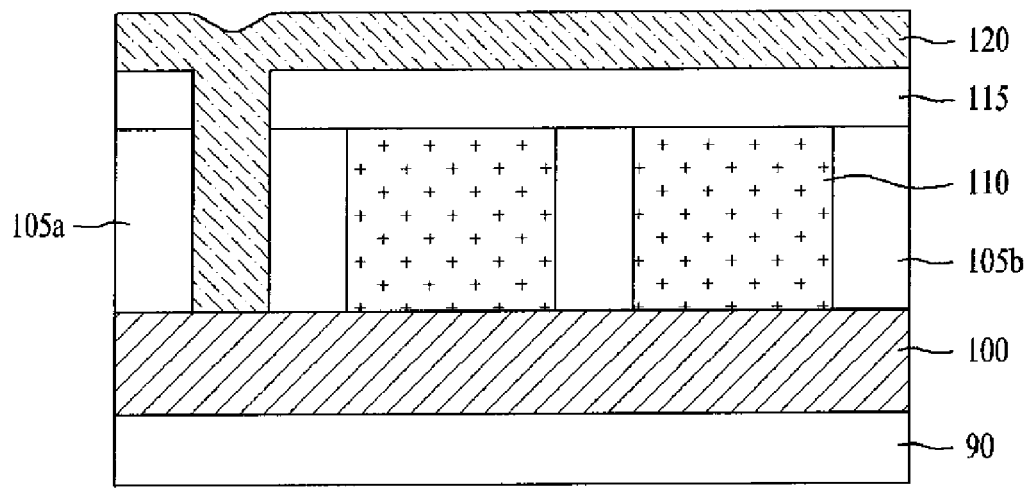

Referring to FIG. 7, electrically conductive material 120 is deposited on to fill the contact hole 117. The conductive material 120 can be formed by CVD of tungsten.

Figure 8:
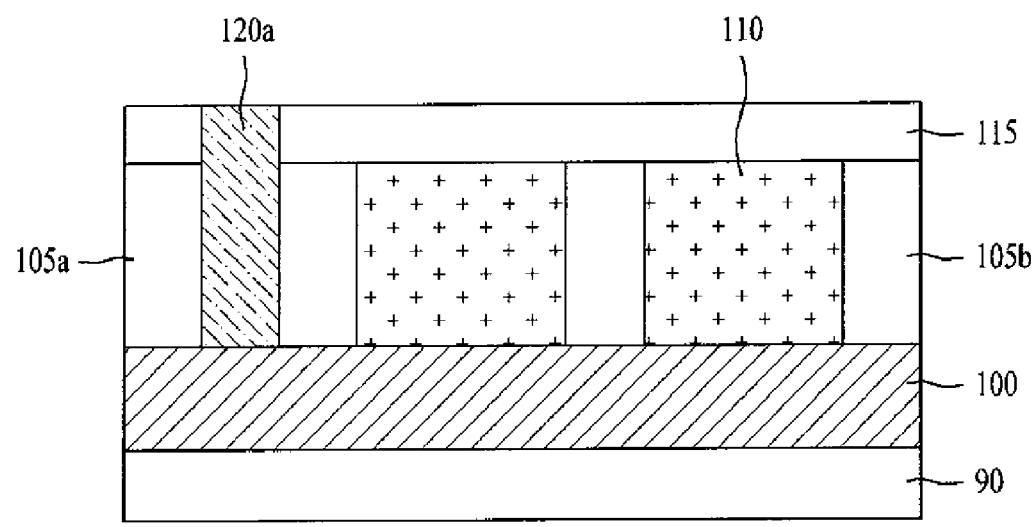

Referring to FIG. 8, the surface of conductive material 120 is planarized until the top surface of capping dielectric 115 is exposed to form contact plug 120a filling the contact hole 117. The contact plug 120a, having sidewalls surrounded by the contact dielectric 105a, can prevent outgas of the low-k material 110, and compensate for mechanical defects in the low-k dielectric material 110. Further, the body dielectric film 105b, disposed in constant intervals in the low-k dielectric material 110, can prevent outgas and compensate mechanical defects of the low-k material.

Figure 9:
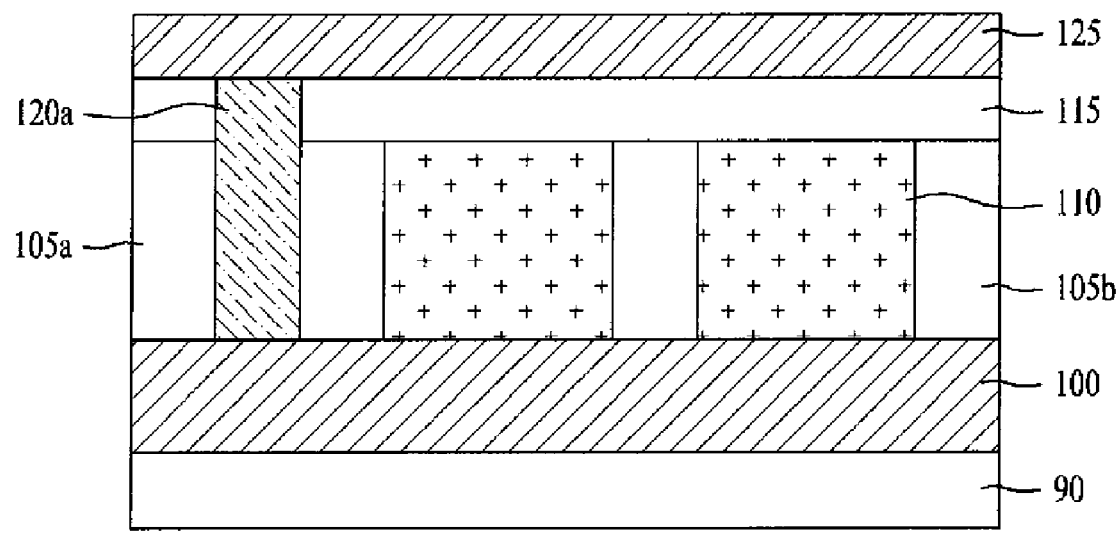
FIG. 9 is a cross sectional view of multiple wiring metals of the present invention.

FIG. 9 is a cross-sectional view for illustrating the multiple wiring metal structure according to the present invention.

Referring to FIG. 9, the multiple wiring metal structure comprises lower wiring metal 100 formed on a semiconductor substrate 90 and contact dielectric film 105a and body dielectric film 105b formed on the lower wiring metal 100. Between the contact and body dielectric films 105a and 105b is filled with low-k dielectric 110a. On the contact and body dielectric films 105a and 105b and the low-k dielectric 110a is formed a capping dielectric 115. Conductive contact plug 120a passes through the capping dielectric 115 and contact dielectric film 105a and electrically interconnected to both the lower wiring metal 100 and upper wiring metal 125.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A multiple wiring metal structure comprising:
   a lower wiring metal formed on a semiconductor substrate;
   a contact dielectric film and a body dielectric film formed on the lower wiring metal;
   a low-k dielectric adapted to fill an opening between the contact and body dielectric films;
   a capping dielectric formed on the contact and body dielectric films; and
   an upper wiring metal connected to the lower wiring metal by a contact plug.

2. The structure of claim 1, wherein the low-k dielectric is at least one of carbonate silicate glass (CSG), alpha-fluorinated amorphous carbon (α-FC), and hydrogen silsesquioxane (HSQ).

3. The structure of claim 1, wherein said contact plug is an electrically conductive material.

4. The structure of claim 3, wherein said contact plug is tungsten.

5. The structure of claim 1, wherein both, said contact dielectric and said capping dielectric, define an opening, said opening adapted to receive said contact plug therein.

6. The structure of claim 1, wherein a plurality of said body dielectric films are disposed in constant intervals on said lower wiring metal.

7. A multiple wiring metal structure comprising:
   a lower wiring metal formed on a semiconductor substrate;
   a plurality of contact dielectric film and a plurality of body dielectric film formed on said lower wiring metal;
   a low-k dielectric adapted to be filled in a plurality of openings defined between each of said body dielectric films and between at least one of said body dielectric film and said contact dielectric film;
   a capping dielectric formed on said contact and body dielectric films; and
   an upper wiring metal connected to the lower wiring metal by a contact plug.

8. The structure according to claim 7, wherein said contact plug is an electrically conductive material.

9. The structure according to claim 7, wherein both, said contact dielectric and said capping dielectric, define an opening, said opening adapted to receive said contact plug therein.

10. The structure according to claim 7, wherein said low-k dielectric is at least one of carbonate silicate glass (CSG), alpha-fluorinated amorphous carbon (.alpha.-FC), and hydrogen silsesquioxane (HSQ).

11. The structure according to claim 10, wherein said low-k dielectric is enclosed between said dielectric layer and said capping dielectric.

12. The structure according to claim 7, wherein each of said body dielectric films are located at constant intervals on said dielectric layer thereby compensating mechanical defects of the low-k dielectric.

* * * * *